United States Patent [19]

Martin et al.

[11] 4,088,917
[45] May 9, 1978

[54] METHOD AND APPARATUS FOR THE PERMANENT POLARIZATION OF PIEZOELECTRIC BODIES

[75] Inventors: Erwin Martin; Helmut Hoffmann; Otto Brünnert, all of Munich, Germany

[73] Assignee: Siemens Aktiengesellschaft, Munich, Germany

[21] Appl. No.: 675,074

[22] Filed: Apr. 8, 1976

[30] Foreign Application Priority Data

Apr. 9, 1975   Germany ............................ 2515478
Dec. 9, 1975   Germany ............................ 2555378

[51] Int. Cl.² ......................................... H01L 41/22
[52] U.S. Cl. ..................................... 310/357; 361/233
[58] Field of Search .................. 310/8, 8.5, 8.6, 9.5, 310/9.6, 8.3, 357; 317/262 F; 29/25.35; 264/22, 24; 361/233

[56] References Cited

U.S. PATENT DOCUMENTS

| 2,486,560 | 11/1949 | Gray | 310/8.3 X |
| 2,702,427 | 2/1955 | Roberts | 29/25.35 |
| 2,928,032 | 3/1960 | Daniel et al. | 317/262 F |
| 3,055,081 | 9/1962 | Roberts | 310/8.5 X |
| 3,108,211 | 10/1963 | Alleman et al. | 317/262 F |
| 3,945,099 | 3/1976 | Kansy | 310/9.5 X |

Primary Examiner—Mark O. Budd
Attorney, Agent, or Firm—Schuyler, Birch, Swindler, McKie & Beckett

[57] ABSTRACT

A method and apparatus for processing piezoelectric bodies to have a permanent polarization for use as electroacoustic transducers or the like are described. During the application of a constant polarizing electric field to a piezoelectric body, the surfaces of the body, which for example, might be in the shape of a disc, have applied thereto a surface pressure. A clamping device having smooth surfaces is used for this purpose.

4 Claims, 2 Drawing Figures

METHOD AND APPARATUS FOR THE PERMANENT POLARIZATION OF PIEZOELECTRIC BODIES

BACKGROUND OF THE INVENTION

The invention relates to a method and an apparatus for the permanent polarization of piezoelectric bodies, more particularly piezoceramic discs for electroacoustic transducers wherein the bodies are exposed to a polarizing constant electrical field.

The activation of a piezoelectric body in a constant electrical field causes an alignment of the regions of spontaneous polarization present therein. Normally, the spontaneous polarization of all the regions in a piezoelectric substance is arranged randomly so as to be statistically distributed to all directions of space so that no piezoelectric effect acting outwardly becomes apparent. Due to the hysteresis properties of the piezoelectric body, after the disappearance of the activating constant field, there is a resultant residual polarization. All electrical magnitudes, including the electromechanical magnitudes coupled therewith, more particularly the electroacoustic coupling factor, depend on the value of the residual polarization. The latter, in turn, is a function of the field strength of the aforesaid constant electrical field, its period of immersion and the temperature at which polarization occurs.

Normally, piezoelectric bodies are polarized in an oil bath, wherein they are connected with the two electrodes mounted on the two disc surfaces parallel to the plane thereof between two contact pins connected to the polarizing power source.

The oil bath serves as a thermally conducting medium through which the piezoelectric body shall be brought to the desired temperature. Additionally, the oil acts as an insulating material so as to reduce the hazards of voltage breakdowns.

When used in electroacoustic transducers, one of the disc surfaces of the piezoelectric body is connected to a permanently clamped diaphragm or plate. A prerequisite for a reliable and permanent connection is that the disc surface concerned be sufficiently smooth.

It has been demonstrated that disc-shaped piezoelectric bodies frequently have warped surfaces prior to polarization. In general, these warpings have a saddle-shaped configuration. During the polarizing process between two contact pins the warpings deteriorate or other warpings appear, which render the connection with a smooth diaphragm or plate difficult. To remedy the situation, time-consuming sorting operations must be performed and the warped piezoceramic bodies must be made sufficiently smooth to meet the above discussed requirement. If, as usual, the polarization occurs in an oil bath, a cleansing process must also be included, e.g., in an ultrasonic bath. This is costly and time-consuming.

Accordingly, it is an object of this invention of provide a method for the polarization of piezoelectric bodies which renders unnecessary the subsequent smoothing and cleaning processes.

SUMMARY OF THE INVENTION

These and other objects of this invention are achieved in that the surfaces of the piezoelectric bodies, parallel to the plane thereof, are exposed to a surface pressure exerted during the immersion period of the polarizing constant field from a clamping device provided with smooth tension surfaces.

The surface pressure helps eliminate or at least reduce existing warpings of the surfaces of the piezoceramic body because the latter, under the influence of a sufficiently strong electrical field has, temporarily, mechanical properties that enable a certain degree of plastic deformation. The surface pressure helps prevent warpings which, in known polarizing procedures, appear during the activation.

If, prior to polarization, the piezoelectric body has particularly heavy warpings, it may be advisable to expose it initially, during the exertion of the surface pressure, to a constant electrical field so as to eliminate or reduce the warpings.

It may also be of advantage to vary, particularly to increase, the surface pressure during the polarization. This will reduce the danger of rupture which arises if a particularly heavily warped disc-shaped piezoelectric body is subjected from the beginning, during polarization, to a fairly strong surface pressure.

A piezoelectric body whose opposite surfaces parallel to the plane of the body are wired with metal electrodes, constitutes a capacitor charged by the aforesaid polarization process. In order to prevent that this charge, after neutralization of the surface pressure acting on the disc surfaces, produces a mechanical effect of a force which, in turn, may produce warpings, it is convenient to link the electrodes electrically together after polarization and prior to neutralization of the surface pressure so as to carry off the stored electrical charge.

Another advantageous development of the invention requires the generation of the constant field acting on the piezoelectric body during the exertion of the surface pressure on it by the charging or discharging surge of current of a capacitor. In this way, the quantity of electricity available for polarization always has a predetermined finite value. This has the advantage that in piezoelectric bodies having for some reason an excessively low contact resistance the constant field necessary for polarization cannot develop. This may directly be utilized for indicating a defect.

Other developments of the invention deal with a novel apparatus for carrying out the method in accordance with the invention. In its simplest form this apparatus is characterized in that a clamping device is provided with stationary smooth bearing surfaces for receiving the disc-shaped piezoelectric body (or bodies) and with movable prestressing elements which may be lowered with a predetermined bearing pressure on to the upper disc surfaces of the piezoelectric body (bodies). The movable prestressing elements are advantageously connected to a pressure plate kept in suitable guiding means, the movement of the pressure plate being controlled, for example, by rods hinged eccentrically to a rotary disc. The movement of the pressure plate may likewise be controlled by pneumatic of hydropneumatic means. It is of advantage to couple the switch operations necessary for controlling the electric switching processes directly with the movement of the pressure plate.

The prestressing elements connected to the movable pressure plate, the configuration of which corresponds essentially to that of the surfaces of the piezoelectric bodies to be polarized, are advantageously connected by independent springs to the pressure plate. The surface pressure acting on the piezoelectric bodies corresponds to the restoring force of the springs and may, for example, be varied, particularly during the polarization process.

For the contact of the electrodes of the piezoelectric bodies the movable prestressing elements may be provided with openings for leading suitable contact elements through without direct contact therewith. These contact elements, which are movable in the openings relative to the prestressing elements, may be placed on the electrodes of the piezoelectric bodies with a contact pressure which is independent of the surface pressure exerted by the prestressing elements. Thus, the quality of contact making is always uniform irrespective of the surface pressure of the prestressing elements.

In order to properly place the piezoelectric bodies in the polarizing device, the stationary smooth bearing surfaces may be provided with a centering device. Since the piezoelectric bodies are comparatively fragile, the centering device must have no bearing surfaces against which the edges of the piezoelectric bodies may strike during the exertion of the surface pressure, as this would increase the danger of rupture.

A further development of the invention by which the aforementioned danger is avoided is characterized in that the centering device comprises a plurality of studs capable of being lowered and which, when not in use, jut with a tapered end out of a base plate carrying the smooth bearing surfaces. The studs establish without ambiguity with their cross-sectional areas situated in the plane of the bearing surfaces the position of the piezoelectric bodies through contact with their edges and which with their cross-sectional areas disposed in lowered condition in the plane of the bearing surfaces have a limited distance from said edges.

A further development of this invention provides a switching arrangement with which, after polarization and after discharge of the polarized bodies, it is indicated automatically if the polarized device has a defect due to disruptive discharge. Furthermore, it must be possible to polarize simultaneously a plurality of piezoelectric bodies, whereby the duration of the polarization process is defined by the switching arrangement. To accomplish this the device for simultaneous polarization containing a plurality of piezoelectric bodies is connected to a display unit indicated concurrently for each body separately an excessively low contact resistance in all piezoelectric bodies contained in the device, and is connected to a control unit controlling the polarization period and subsequent discharge of the piezoelectric bodies.

This results in the advantage that at the end of the polarization process it can be seen immediately if any component is defective and, if so, which one, so that additional testing will not be required. There is also the advantage that the duration of the polarization process can be adjusted to obtain optimum performance and can be made independent of operating errors. Finally, possible deformation of the body by the electrical charge of the polarized body is effectively prevented by the automatic tapping of the electrical charge.

As mentioned earlier, the constant field necessary for polarization is conveniently generated by the discharging or charging surge of current of a capacitor. According to an advantageous further development of the invention, the contact elements for the electrical contacts of the electrodes of the piezoelectric bodies may be connected into the charging circuit of a capacitor. Furthermore, two measuring resistors are conveniently inserted in the charging circuit, the first being connected to an electronic indicator means by a timing element adapted to the time constant of the charging circuit. The resistance of the first measuring resistor is that in the presence of an insufficient insulation resistance of the piezoelectric body the voltage occurring is greater than the switching voltage of the electronic indicator means. Hence, the electronic indicator means generates a signal that indicates an excessively low insulation resistance when the voltage drop across the first measuring resistor, during or after the charging, is greater than the switching voltage. The second measuring resistor is connected by a second timing element determining the polarizing period to the exciter circuit of a relay. The contacts of the relay are operable to open the charging circuit of the capacitor and link together the two electrodes of the piezoelectric body.

The aforementioned relay may, for example, be connected into the controlled circuit of a controllable electrically bistable switching element, e.g., a thyristor. The gates of the switching element may be triggered via another electrically bistable switching element which is switched on by the voltage drop generated when the capacitor across the second measuring resistor is being charged. The second timing element is inserted in the connection between the first and second controllable electrically bistable switching element. In this way, it is ensured that after switching on the charging circuit the relay always responds after a time interval which is independent of the insulation resistance of the piezoelectric body to be polarized.

BRIEF DESCRIPTION OF THE DRAWINGS

The principles of the invention will be more readily understood by reference to a description of a preferred form of execution of the method of the invention and of a preferred embodiment of apparatus for performing the method given below in conjunction with drawings which are briefly described as follows.

DETAILED DESCRIPTION OF THE PREFERRED FORM OF THE METHOD OF THE INVENTION AND PREFERRED APPARATUS FOR EXECUTING THE METHOD

Figure 1:
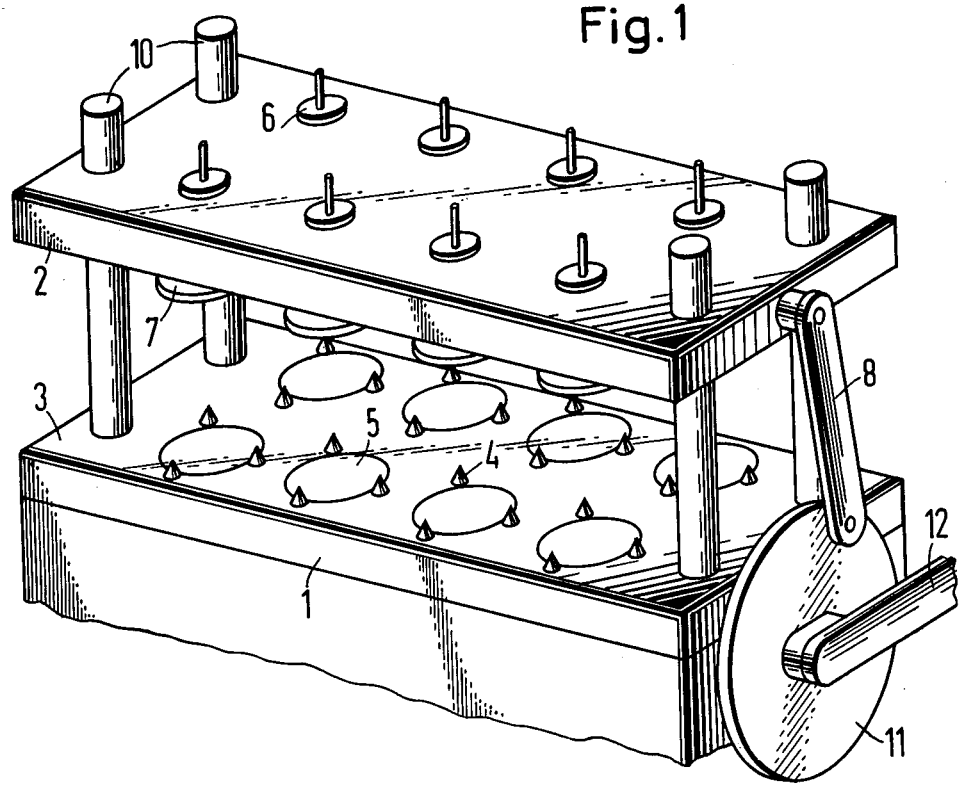
FIG. 1 is a perspective view of apparatus for carrying out the method in accordance with the principles of this invention.

The device shown in FIG. 1 comprises a clamping frame having a stationary base plate 1 and a movable plate 2. A plate 3 of insulaion material is mounted on base plate 1. Contact shims 5 are attached to plate 3 and are electrically insulated from the frame. Contact shims 5 have a circular contour and are thus adapted to the configuration of the disc-shaped piezoelectric bodies to be polarized. Other shapes can, of course, be used.

Each of the contact shims 5 is surrounded by three centering lugs 4 which are spring-loaded and, when not in use, jut with a tapered end portion of plate 3 of insulating material. In this condition their cross-sectional areas in the plane of plate 3 come into contact with a circle, the cross-section of which corresponds to that of the piezoceramic body to be polarized. In this way they define a funnel-shaped receiving space in which the bodies may be placed. As soon as the centering lugs 4 are sunk by lowering the pressure plate 2 toward the plate 3 of insulation material, they release the edges of the bodies hitherto in contact therewith due to their conical structure. This prevents the sensitive piezoelectric bodies from being ruptured.

Pressure plate 2, which is "floated" around column sleeves 10 is moved by means of an eccentric device comprising rods 8, eccentric disc 11 and handle 12. The pressure plate carries a number of plungers 7 corresponding to the number of contact shims and which are spring-loaded in pressure plate 2. To each plunger 7 is assigned a contact pin (not shown) which juts resiliently out of an orifice on the bottom surface of plunger 7 and bears against the upper electrode of the body to be polarized with a contact force independent of the pressure of the plunger when pressure plate 2 is lowered. The contact pins (not shown) are electrically connected to terminals 6 jutting out of the upper surface of pressure plate 2. The terminals 6 serve to feed the polarization voltage through the aforementioned contact pins to the upper electrodes of the piezoelectric bodies being polarized.

Figure 2:
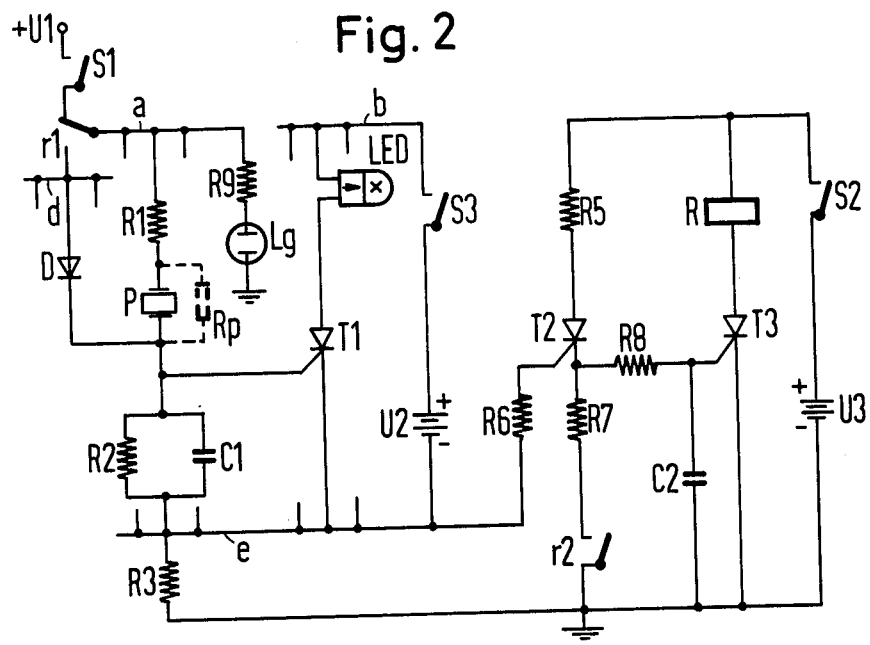
FIG. 2 is a schematic diagram of a switching arrangement for controlling the polarization process used in carrying out the method of the invention.

The circuit shown in FIG. 2 comprises a polarization stage A, an indicator stage B, and a time-control stage C. In the polarization stage A the body P to be polarized is connected in series with a fixed value resistor R1, a RC network comprising the resistor R2 and the capacitor C1, and another fixed value resistor R3. The series resistor R1 is fed by the polarization voltage U1 through a switch S1 inserted in the connection to the positive pole +U1 of the polarization voltage. The circuit further contains a contact r1 of a relay R disposed in time-control stage C. Another component of the polarization stage is the glow lamp Lg that may be connected over a series resistor R9 to the polarization voltage for the purpose of signalling the polarization process. The insulation resistance of the piezoelectric body P is indicated by the parallel resistor Rp shown by the dotted line. Over the operating side of relay contact r1 there is connected a discharge circuit for piezoelectric body P which is extended over diode D. The multiple signs placed on bus lines a, e and d are meant to imply that the corresponding circuits are separately provided for all piezoelectric bodies that may be placed in the polarization device of FIG. 1. Accordingly, diode D, resistors R1 and R2 and capacitor C1 are separately assigned to the individual piezoelectric bodies.

The indicator stage B comprises a thyristor T1 which may be triggered by the voltage occurring across capacitor C1 and in the controlled circuit of which there is disposed a light-emitting diode LED. The multiple signs on bus lines b and e indicate that a thyristor T1 and a light-emitting diode LED are assigned individually to each piezoelectric body P. Indicator stage B is fed by d.c. power source U2 by means of a supply circuit containing a switch S3.

Time-control stage C comprises an input thyristor T2 and an output thyristor T3 linked together over a timing element formed from a resistor R8 and a capacitor C2.

Input thyristor T2 is triggered over coupling resister R6 by the voltage dropping across resistor R3 of polarization stage A. The exciting coil of relay R mentioned above is disposed in the controlled circuit of output thyristor T3. Load resistors R5 and R7 and a break contact r2 of relay R complete the circuit. A d.c. power source U3 which may be connected into the circuit by a switch S2 provides the operating voltage for the timing circuit.

Switches S1 and S2 are preferably coupled to one another and may, for example, be designed as make contacts of a pushbutton.

The polarization device operates in the following manner. First, the ceramic discs to be polarized are installed by means of a suitable tool (e.g. a suction nozzle connected to a vacuum pump) on contact shims 5 of the prestressing frame. Pressure plate 2 is then lowered by actuating hand lever 12. Plungers 7 situated in the pressure plate resiliently urge the conical centering lugs surrounding contact shims 5 toward base plate 1, so that the edges of the ceramic discs are without direct contact. Concurrently, the contact pins (not shown) assigned to plungers 7 urge the upper electrode of the associated ceramic discs with a predetermined contact force. Furthermore, the plungers themselves are urged resiliently toward the ceramic discs, pressing them against contact shims 5 with a predetermined contact force.

When switches S1 and S2 (FIG. 2) are closed, polarization stage A and time-control stage C are connected in circuit. Polarization voltage U1 causes capacitor C1 to be charged. The appropriate charge current flows through piezoelectric body P and impresses therein the polarization field strength. The charge current of capacitor C1 flows further through resistor R3 and produces a voltage drop thereacross, as a result of which thyristor T2 of time-control stage C is fired. In this way a voltage drop is generated across resistor R7 which, after a time interval defined by the time constant of the timing element composed of resistor R8 and C2, ignites thyristor T3 so that the relay R in the output circuit thereof is energized. The relay operates its contact r1 and thus breaks the polarization circuit, i.e., the charge circuit of capacitor C1. At the same time, the contact r1 closes a discharge circuit for the piezoelectric body P, which is extended over the resistor R1 and the diode D. By opening the contact r1 of relay R, the thyristor T2 is disconnected, thereby terminating the polarization process. By opening the switch S1, the polarization voltage U1 is switched off by the contact pins. The simultaneous opening of switch S2 causes the release of relay R.

After the closing of switch S1 there appear in the charge circuit for capacitor C1 in which the polarization field for the piezoelectric body P is generated transient phenomena, the time function of which are defined by the capacitances and resistances in that circuit. The time function of the voltage across capacitor C1, which simultaneously generates the control voltage for thyristor T1, is essentially defined by the value of insulation resistance Rp. Hence, this voltage is suitable for the evaluation of the insulation resistance Rp or for signalling faulty specimens of the piezoelectric bodies.

Generally, that is, when the insulation resistance R1 has a finite value different from zero, the time function of the voltage between the electrodes of the piezoelectric body P and the voltage across the capacitor C1 is composed of the overlapping of two exponential functions and a constant value. If the insulation resistance Rp falls below a minimum value, which indicates a faulty specimen, the saturation field strength necessary for the sufficient permanent polarization cannot develop in the piezoelectric body. The time function of the voltage across capacitor C1 has in this case a peak value which is greater than the control voltage of thyristor T1 necessary for the ignition, so that the thyristor is fired and indicates the faulty specimen due to the flashing of the light-emitting diode LED in the output circuit thereof. Due to the electrically bistable properties of thyristor T1, the indicating state is maintained even when the prestressing frame (FIG. 1) is reopened. If the light-emitting diodes are situated in the vicinity of the contact shims 5, the defective specimens can conveniently be sorted out. After this sorting out the thyristor T1 and, hence, the light-emitting diode LED in the output circuit thereof is disconnected by opening the switch S3.

The device for carrying out the method in accordance with the invention may also be designed such as to make fully automatic operation possible. To this end, the contact shims 5 may, for example, be placed on a rotary table. The feeding and carrying away of the piezoelectric bodies may be controlled by pneumatic means. The defective specimens may likewise be sorted out automatically, using known The principles of this invention are described hereinabove by describing a preferred form of execution of the method of the invention and a preferred embodiment of inventive apparatus for carrying out the aforementioned method. It is contemplated that the method steps, as specifically described, and the preferred embodiment of the apparatus for carrying them out can be modified or changed while remaining within the scope of the invention as defined by the appended claims.

We claim:
1. A method for permanently polarizing a piezoelectric body, comprising the steps of:
   exposing the body to a constant, polarizing electric field,
   applying, during said exposing step, a surface pressure to opposite surfaces of the body, and
   varying the surface pressure in an increasing direction during said applying step.

2. Apparatus for permanently polarizing a piezoelectric body comprising:
   clamping means including means for receiving and supporting said piezoelectric body including a bearing surface on which a surface of said piezoelectric body rests, and means for exerting a surface pressure on opposite surfaces of said piezoelectric body including a vertically movable stressing member for exerting a predetermined surface pressure on an opposite surface of said piezoelectric body, said stressing member having an aperture defined therein which is arranged to permit an electrical connection therethrough to an electrode in said piezoelectric body, a movable contact element in said aperture arranged to be in electrical contact with said electrode when said stressing member is in mechanical contact with said piezoelectric body, said movable contact element being arranged to exert a contact pressure on the said electrode which is independent of the surface pressure exerted by said stressing member, and
   means for producing a constant polarizing electric field and for exposing said piezoelectric body to the electric field.

3. The apparatus defined in claim 2 wherein said means for centering and supporting includes centering means for properly positioning said piezoelectric body for receiving surface pressure from said means for exerting, said centering means comprising a plurality of lugs placed on said means for receiving and supporting in a configuration conforming to the periphery of said piezoelectric body so that the edge of said piezoelectric body placed on said means for receiving and supporting will be in mechanical contact with said plurality of lugs, said plurality of lugs being resiliently mounted on said means for receiving and supporting so as to withdraw therein out of mechanical contact with the edge of said piezoelectric body under pressure from said means for exerting.

4. The apparatus defined in claim 2 further comprising:
   a capacitor,
   a charging circuit for said capacitor, and
   switching means operable to connect the electrodes of said piezoelectric body in said charging circuit, the electrodes of said piezoelectric body being connected in series in said charging circuit, said charging circuit further including:
   a source of voltage,
   first and second series-connected resistances which are connected in series with said voltage source and said piezoelectric body,
   a voltage responsive indicating means having a predetermined switching voltage and which is coupled to said charging unit for indicating, responsive to the voltage values appearing across said first resistance and the insulation resistance of said piezoelectric body, when the insulation resistance of said piezoelectric body falls below a predetermined minimum value and wherein said switching means further comprises:
   timing means connected to respond to the voltage appearing across said second resistance to produce a predetermined timing signal value after a preset period of time and
   relay means having a pair of contacts interposed in said charging circuit, said relay means being coupled to said timing means as to operate to open said pair of contacts upon the appearance of said predetermined timing signal value.

* * * * *